(12) United States Patent
Seah Teo Leng

(10) Patent No.: US 8,455,350 B2
(45) Date of Patent: Jun. 4, 2013

(54) INTEGRATED CIRCUIT SYSTEM EMPLOYING GATE SHIELD AND/OR GROUND SHIELD

(75) Inventor: Xavier Seah Teo Leng, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 1383 days.

(21) Appl. No.: 11/465,793

(22) Filed: Aug. 18, 2006

(65) Prior Publication Data

US 2008/0042236 A1 Feb. 21, 2008

(51) Int. Cl.
*H01L 29/00* (2006.01)

(52) U.S. Cl.
USPC ........ 438/634; 438/629; 438/637; 438/638; 438/640; 438/645

(58) Field of Classification Search
USPC .......... 257/382, 384, 774; 438/629, 634, 438/637, 638, 639, 640, 645
See application file for complete search history.

(56) References Cited

U.S. PATENT DOCUMENTS

| | | | |
|---|---|---|---|
| 6,107,160 A | 8/2000 | Hebert et al. | |
| 6,222,229 B1 | 4/2001 | Hebert et al. | |
| 6,232,637 B1 * | 5/2001 | Gardner et al. | 257/368 |
| 6,737,308 B2 * | 5/2004 | Kim | 438/197 |
| 6,762,088 B2 | 7/2004 | Acosta et al. | |
| 7,037,800 B2 * | 5/2006 | Pyo | 438/381 |
| 2003/0222289 A1 * | 12/2003 | Nakamura | 257/274 |
| 2006/0263958 A1 * | 11/2006 | Kajimoto et al. | 438/195 |

* cited by examiner

*Primary Examiner* — Tan N Tran
(74) *Attorney, Agent, or Firm* — Ishimaru & Associates LLP

(57) ABSTRACT

A method for manufacturing an integrated circuit system that includes: forming a substrate with an active region; depositing a material over the substrate to act as an etch stop and define a source and a drain; depositing a first dielectric over the substrate; processing the first dielectric to form features within the first dielectric including a shield; and depositing fill within the features to electrically connect the shield to the source of the active region by a single process step.

5 Claims, 4 Drawing Sheets

INTEGRATED CIRCUIT SYSTEM EMPLOYING GATE SHIELD AND/OR GROUND SHIELD

TECHNICAL FIELD

The present invention relates generally to an integrated circuit system, and more particularly to an integrated circuit system employing a gate shield and/or a ground shield.

BACKGROUND ART

Integrated circuit systems have infiltrated their existence into all aspects of human everyday life. For instance, integrated circuit chips are commonplace in many of today's electronic devices, such as, cellphones, portable music players, video game players, notebook computers, televisions and even automobiles.

In particular, radio frequency laterally diffused metal-oxide-semiconductor technology (RF LDMOS), Power MOSFET technology, and radio frequency complementary-metal-oxide-semiconductor technology (RF CMOS) are an important part of integrated circuit chip designs. Unfortunately, RF LDMOS, Power MOSFET, and RF CMOS technologies are subject to Miller capacitance, hot carrier injection, and eddy current problems. RF LDMOS and Power MOSFET technology commonly employ a gate shield to reduce the effects of Miller capacitance and hot carrier injection, while RF CMOS technology commonly employs a radio frequency ground shield to reduce the effects of eddy current to achieve high Q factor values for inductors. Additionally, RF LDMOS, Power MOSFET, and RF CMOS technologies commonly employ a Metal-1 layer to connect the shield to the source region of the field effect transistor through a tungsten plug contact, which incurs additional contact resistance.

Although the gate shield and the ground shield solutions provide some measure of relief from effects, such as Miller capacitance, hot carrier injection, and inductor Q factor degradation, there still remains the problem of additional manufacturing steps to produce such solutions. For instance, RF LDMOS technology commonly requires the extra manufacturing steps of depositing, masking and then reduction etching of the gate shield material, such as a polysilicon and/or a polysilicon/tungsten polycide, to form the gate shield. A low resistivity metal shield is desired for the gate shield, but to form a low resistivity metal gate shield, processing steps such as the reduction etching of the gate material can be difficult for refractory metals, such as tungsten. The extra manufacturing steps required by these methods add to the complexity of the process as well as the amount of time needed to manufacture the final product.

Additionally, RF CMOS technology commonly forms a polysilicon ground shield during gate definition steps but requires the formation of a Metal-1 layer to connect the ground shield to the RF ground/source region through a tungsten plug contact. This connection of the ground shield to the RF ground/source region via the Metal-1 layer and the tungsten plug increases the contact resistance between the ground shield and the RF ground/source region. Since serial resistances are additive, the additional contact resistance at the interface between the Metal-1 layer and the ground shield and the RF ground/source region will only increase the overall resistance of the path. The increased resistance of this path will only diminish the effectiveness of the ground shield.

Thus, a need still remains for a more efficient and low cost alternative to present day RF LDMOS, Power MOSFET and RF CMOS technology fabrication.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit system that includes: forming a substrate with an active region; depositing a material over the substrate to act as an etch stop and define a source and a drain; depositing a first dielectric over the substrate; processing the first dielectric to form features within the first dielectric including a shield; and depositing fill within the features to electrically connect the shield to the source of the active region by a single process step.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 2:
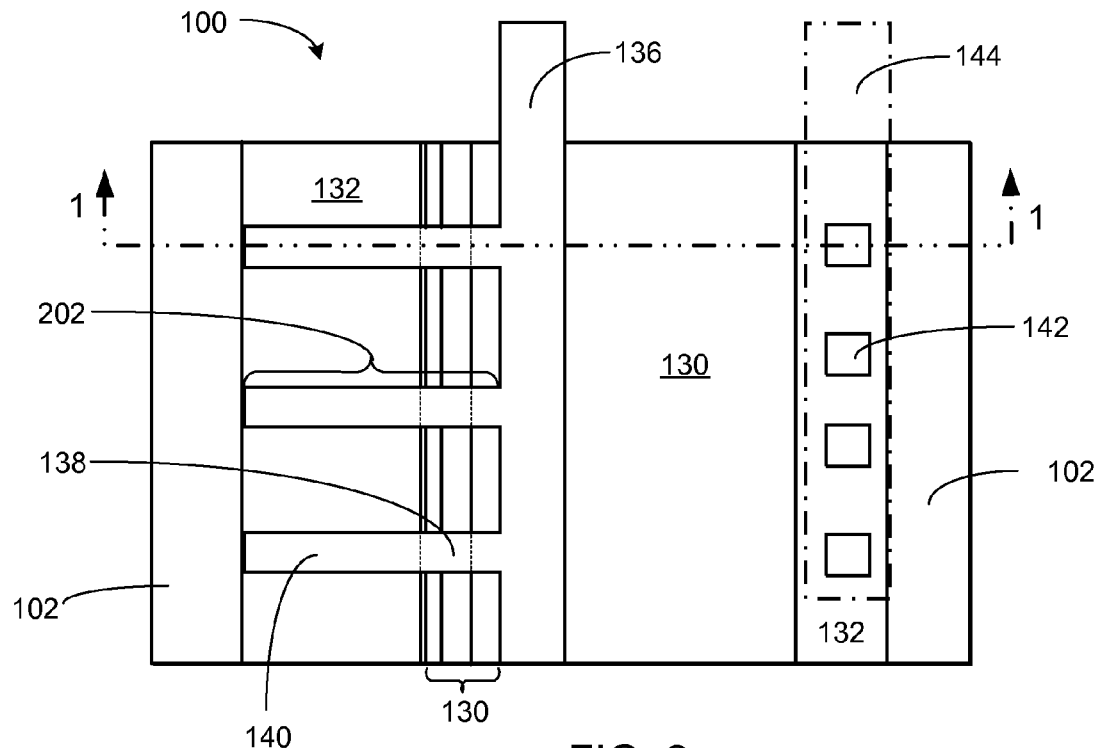
FIG. 2 is a plan view of FIG. 1 with interlayer dielectrics removed.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGS. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. As used herein, the term "first conductivity type" may include a p-type doped region and the term "second conductivity type" may include an n-type doped region.

Figure 1:
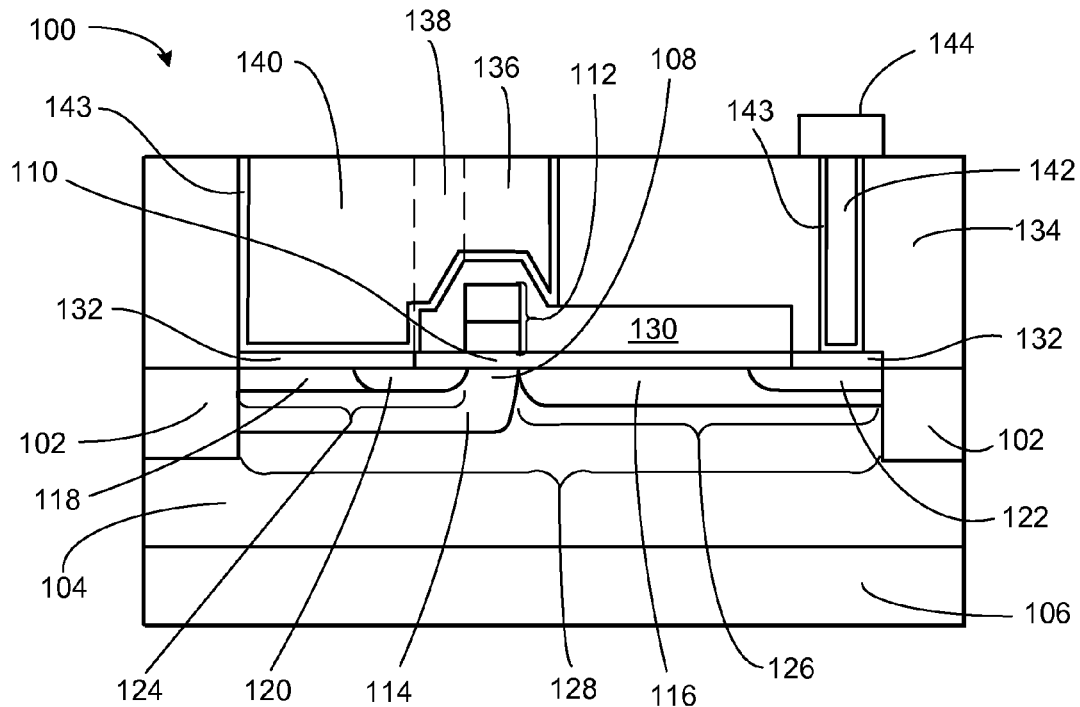
FIG. 1 is a cross-sectional view of FIG. 2 along line 1-1 in accordance with an embodiment of the present invention.
Figure 3:
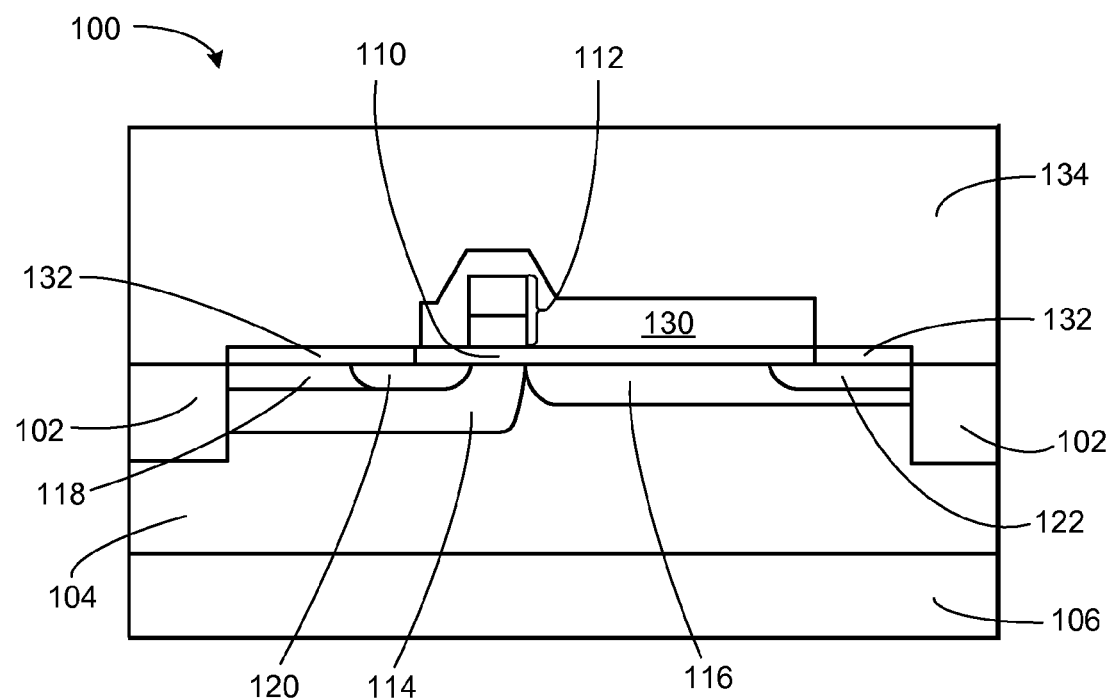
FIG. 3 is a cross sectional view of an intermediate fabrication stage of FIG. 1.

Although FIGS. 1-3 depict a RF LDMOS or Power MOSFET integrated circuit system, it is to be understood that the present invention is not limited to such devices. For example, the present invention may apply to any integrated circuit system that employs a gate shield.

Referring now to FIG. 1, therein is shown a cross-sectional view of FIG. 2 along line 1-1 in accordance with an embodiment of the present invention.

The integrated circuit system 100 is commonly fabricated by forming isolation regions 102, such as shallow trench isolation (STI) or field oxide (FOX) regions, in a lightly doped first conductivity type layer 104. The lightly doped first conductivity type layer 104 is formed over a heavily doped first conductivity type substrate 106. The lightly doped first conductivity type layer 104 is often an epitaxially grown layer.

After the isolation regions 102 are formed, a threshold voltage implant is performed to adjust the dopant concentration within a channel 108 of the lightly doped first conductivity type layer 104. A gate oxide layer 110 is formed by exposing the integrated circuit system 100 to an oxidizing atmosphere. After the gate oxide layer 110 is formed, a gate layer is deposited, masked, and etched to form a gate 112. By way of example, the gate 112 includes a bottom polysilicon layer and a tungsten silicide top layer.

After these structures are formed, various mask, implant, and thermal diffusion steps form a first conductivity type body 114, a single or two step graded second conductivity type lightly doped drain 116, a heavily doped first conductivity type body 118 adjacent a heavily doped second conductivity type source 120, and a heavily doped second conductivity type drain 122. As an exemplary illustration, the heavily doped second conductivity type source 120 and the heavily doped second conductivity type drain 122 can be formed together and to the same depth.

The heavily doped first conductivity type body 118 and the heavily doped second conductivity type source 120 are collectively referred to as the body/source 124 and the single or two step graded second conductivity type lightly doped drain 116 and the heavily doped second conductivity type drain 122 are collectively referred to as the drain 126. The area between the isolation regions 102 is defined as an active region 128.

After formation of the active region 128, a material 130 is deposited, patterned, and etched by techniques well known in the art to leave exposed conductive areas where salicide contacts 132 should be formed. By such methods, the salicide contacts 132 are properly aligned with the body/source 124 and the drain 126.

Additionally, the material 130 can also act as an etch stop in later processing steps. The material 130 should have a high selectivity with regard to the chosen dielectric employed in later processing steps. The material 130 can be a silicon nitride layer ($Si_3N_4$), or more specifically, the material 130 can be a 2,000 Å silicon nitride layer. It is to be understood that the material 130 need not be silicon nitride, what is important is that the material 130 serves both the functions of defining the salicide contacts 132 and also act as an etch stop during later processing steps.

After deposition of the material 130 and formation of the salicide contacts 132, then a first dielectric 134 is deposited. The first dielectric 134 is commonly referred to as an interlayer or inter-level dielectric. By way of example and not by way of limitation, the first dielectric layer 134 may be an oxide, such as silicon dioxide. After deposition, the first dielectric 134 is polished, masked and contact etched by techniques well known in the art to define one or more features, such as, a shield 136, a shield interconnect line 138, a source bar 140 and a drain via 142. As an exemplary illustration, the shield 136 may include a gate shield.

By way of example and not by way of limitation, the contact etch may have selectivity to silicon nitride while maintaining the ability to break through any oxide formation that may have occurred on the body/source 124 and the drain 126. As an exemplary illustration, some commonly employed etch selective gases could be fluorine chemistry gases, such as, $C_4F_8$ and $CHF_3$. However, it is to be understood that fluorine chemistry gases are not essential, what is important is that the first dielectric layer 134 contact etch maintain a high etch selectivity and not penetrate the salicide contacts 132.

By employing the above discussed optimized contact etch, the shield 136 line width and the shield interconnect line 138 line width can be kept close to the minimum feature size of the contact mask and thereby helps to prevent void formation during subsequent filling steps. Thicker fill deposition can be adopted if larger line widths are desired. With shrinking circuit geometries and thinner layers of resist, increased selectivity is necessary to ensure critical dimension and profile control in most advanced processes.

After etching the dielectric 134 to define the shield 136, the shield interconnect line 138, the source bar 140 and the drain via 142, a barrier layer 143 may be deposited. The barrier layer 143 helps to form reliable ohmic contacts to shallow junctions without material diffusion problems. By way of example and not by way of limitation, the barrier layer 143 can be a titanium/titanium nitride layer. It is to be understood that the chemical composition of the barrier layer 143 is not essential, what is important is that the barrier layer 143 possess the properties of a good diffusion barrier, high electrical conductivity, good adhesion, resistance to electromigration, and stability at high temperatures.

Regardless of the barrier layer 143 deposition, the shield 136, the shield interconnect line 138, the source bar 140 and the drain via 142 are filled with a low resistivity material by one or more deposition steps. As an exemplary illustration, the low resistivity material can be a refractory metal, or more specifically, a metal including tungsten. However, it is to be understood that the type of low resistivity material chosen is not essential. By filling the shield 136 in this manner, a gate shield can be easily incorporated through a single damascene process without the additional manufacturing steps of the prior art.

Furthermore, the single damascene process also allows the designer to fabricate the shield 136 in electrical contact with the body/source 124 through the use of a low resistivity material entirely contained within the first dielectric 134. The shield interconnect line 138 and the source bar 140 provide local interconnects between the shield 136 and the body/source 124. By forming the electrical contact between the shield 136 and the body/source 124 entirely within the first dielectric 134, the Metal-1 connection (e.g., a back end of line metallization interconnect) between the shield 136 and the body/source 124, of the prior art, can be eliminated.

Additionally, it should be noted that the source bar 140 minimum resistance contact with the salicide contacts 132 is maintained because the first dielectric layer 134 contact etch, mentioned above, is specifically optimized to not alter the salicide contacts 132.

After filling the shield 136, the shield interconnect line 138, the source bar 140 and the drain via 142, the excess fill is removed by planarization techniques well known within the art, such as, chemical mechanical polishing (CMP). After planarization, a metal is deposited, masked and etched by techniques well know in the art, to form a metal drain interconnect 144. The metal drain interconnect 144 provides electrical contact to the drain 126 through the drain via 142. By way of example, the metal drain interconnect 144 may be made from materials such as aluminum, copper and their alloys.

Finally, the single damascene process also reduces resistance between the shield 136 and the body/source 124. Since serial resistances are additive, by eliminating the need for the Metal-1 layer to connect the body/source 124 with the shield 136, the contact resistance of such interface is eliminated and the overall resistance of the conductive path between the body/source 124 with the shield 136 is reduced.

Referring now to FIG. 2, therein is shown a plan view of FIG. 1 with interlayer dielectrics removed. FIG. 2 shows the isolation regions 102, the material 130, the salicide regions 132, the shield 136, the shield interconnect line 138, the source bar 140, the drain via 142, the metal drain interconnect 144 (shown in phantom outline) and a projection 202. By removing the first dielectric 134, some key aspects of an embodiment of the invention may be shown. Most notable is the formation of the shield 136 with projection 202 comprised by the shield interconnect line 138 and the source bar 140. By forming the shield 136, the shield interconnect line 138, and the source bar 140 as a unitary element, a low resistance gate shield can be formed in a single process step, thereby eliminating the expense and time of additional manufacturing steps.

Referring now to FIG. 3, therein is shown a cross-sectional view of an intermediate fabrication stage of the integrated circuit system 100, of FIG. 1. FIG. 3 illustrates the isolation regions 102, the lightly doped first conductivity type layer 104, the heavily doped first conductivity type substrate 106, the gate oxide layer 110, the gate 112, the first conductivity type body 114, the single or two step graded second conductivity type lightly doped drain 116, the heavily doped first conductivity type body 118, the heavily doped second conductivity type source 120, the heavily doped second conductivity type drain 122, the material 130, the salicide contacts 132 and the first dielectric layer 134.

FIG. 3 highlights the differences between the prior art methods and the present invention by illustrating the formation of the first dielectric layer 134 before the shield is formed. As mentioned above, RF LDMOS and Power MOSFET prior art methods form the gate shield first and then deposit the dielectric. These methods require additional processing steps, such as, deposition, masking and reduction etching of the polysilicon or polycide gate shield material, which is quite resistive.

Unlike prior art methods, the present invention forms the first dielectric layer 134 first and then forms the shield 136, of FIGS. 1 and 2, into or through the first dielectric layer 134. This method enables consolidation of the gate shield formation step with the formation of the shield interconnect line 138, the source plug 140 and the drain via 142. By forming all features within the first dielectric layer 134 by a single masking step, the additional processing steps of deposition, masking and reduction etching of the gate material of the prior art methods can be eliminated.

Figure 5:
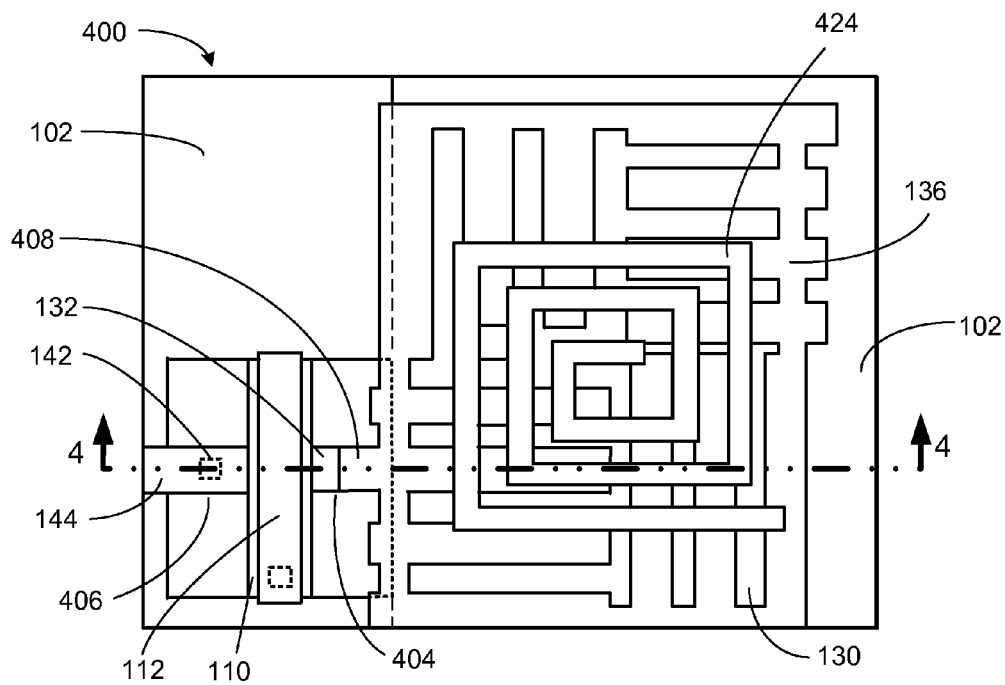
FIG. 5 is a plan view of FIG. 4 with interlayer dielectrics removed.
Figure 4:
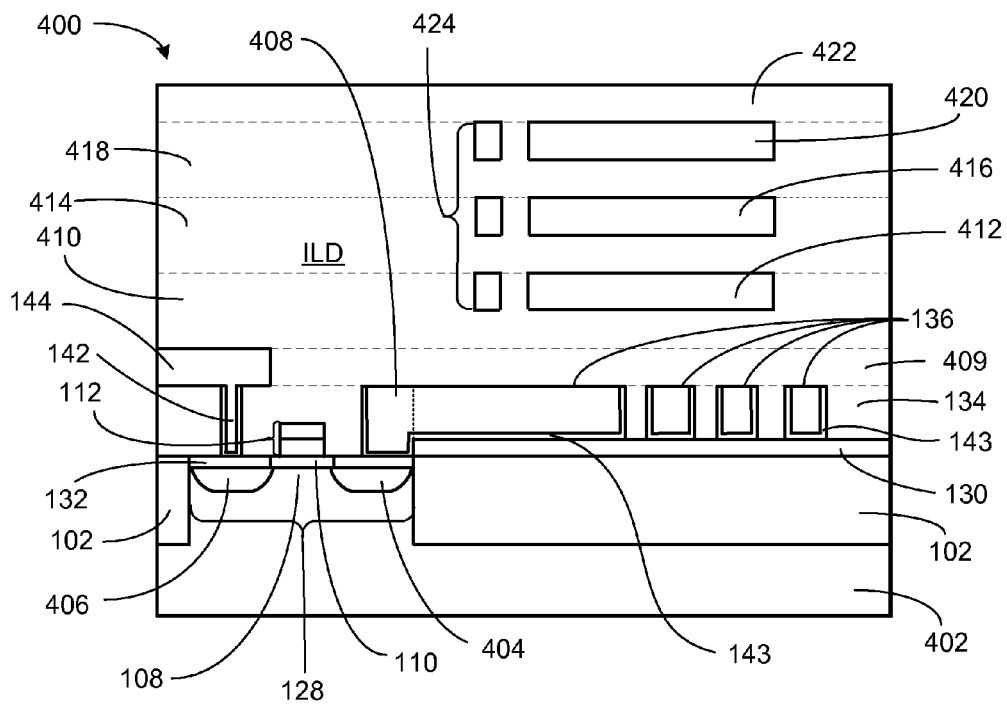
FIG. 4 is a cross-sectional view of FIG. 5 along line 4-4 in accordance with another embodiment of the present invention.
Figure 6:
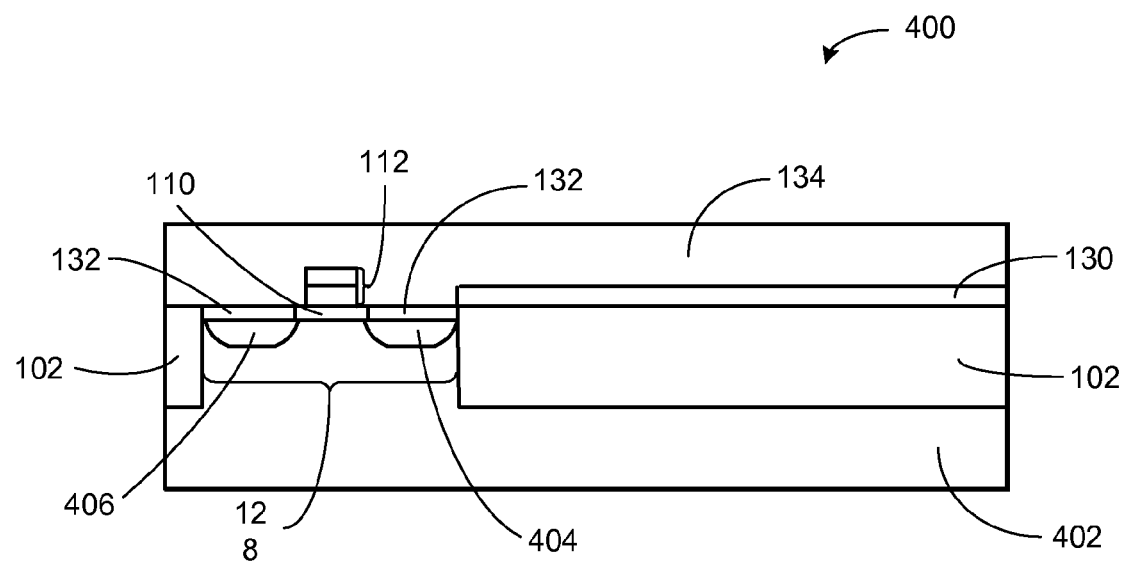
FIG. 6 is a cross sectional view of an intermediate fabrication stage of FIG. 4.

Referring now to FIG. 4, therein is shown a cross-sectional view of FIG. 5 along line 4-4 in accordance with another embodiment of the present invention. Although FIGS. 4-6 depict an integrated circuit system 400, such as a radio frequency complementary metal-oxide-semiconductor (RF CMOS) integrated circuit system, it is to be understood that the present invention is not limited to such devices. For example, the present invention may apply to any integrated circuit system that employs a ground shield.

The integrated circuit system 400 is commonly fabricated by forming isolation regions 102, such as shallow trench isolation (STI) or field oxide (FOX) regions, in a substrate 402, such as, a p-type or n-type. After the isolation regions 102 are formed, a threshold voltage implant is performed to adjust the dopant concentration within the channel 108 of the substrate 402. A gate oxide layer 110 is formed by exposing the integrated circuit system to an oxidizing atmosphere. After the gate oxide layer 110 is formed, a gate layer is deposited, masked, and etched to form a gate 112. By way of example, the gate 112 includes a bottom polysilicon layer and a silicide top layer.

After these structures are formed, various mask, implant, and thermal diffusion steps form the appropriate N+ or P+ regions within the substrate 402. These regions act as a RF ground/source 404 (e.g.—a source) and a RF drain 406 (e.g.—a drain). If desired, NLDD and PLDD regions (not shown) are also formed by techniques well known in the art. The area between the isolation regions 102 is defined as the active region 128.

After formation of the active region 128, a material 130 is deposited, patterned, and etched by techniques well known in the art to leave exposed conductive areas where salicide contacts 132 should be formed. By such methods, the salicide contacts 132 are properly aligned with the RF ground/source 404 and the RF drain 406.

Additionally, the material 130 may also act as an etch stop in later processing steps. The material 130 should have a high selectivity with regard to the chosen dielectric employed in later processing steps. The material 130 can be a silicon nitride layer ($Si_3N_4$), or more specifically, the material 130 can be a 2,000 Å silicon nitride layer. It is to be understood that the material 130 need not be silicon nitride, what is important is that the material 130 serves both the functions of defining the salicide contacts 132 and also act as an etch stop during later processing steps.

After deposition of the material 130 and formation of the salicide contacts 132, then a first dielectric 134 is deposited. The first dielectric 134 is commonly referred to as an interlayer or inter-level dielectric. By way of example and not by way of limitation, the first dielectric layer 134 may be an oxide, such as silicon dioxide. After deposition, the first dielectric 134 is polished, masked and contact etched by techniques well known in the art to define one or more features, such as, the shield 136, the drain via 142 and the RF ground/source bar 408. By way of example and not by way of limitation, the contact etch may have selectivity to silicon nitride while maintaining the ability to break through any oxide formation that may have occurred on the RF ground/source 404 and the RF drain 406.

As an exemplary illustration, some commonly employed etch selective gases could be fluorine chemistry gases, such as, $C_4F_8$ and $CHF_3$. However, it is to be understood that fluorine chemistry gases are not essential, what is important is that the first dielectric layer 134 contact etch maintain a high etch selectivity and not penetrate the material 130 and the salicide contacts 132.

By employing the above discussed optimized contact etch, the shield 136 line width can be kept close to the minimum feature size of the contact mask and thereby helps to prevent void formation during subsequent filling steps. Thicker fill deposition can be adopted if larger line widths are desired.

Additionally, it should be noted that the RF ground/source bar 408 minimum resistance contact with the salicide contacts 132 is maintained because the first dielectric layer 134 contact etch, mentioned above, is specifically optimized to not alter the salicide contacts 132. Furthermore, the RF ground/source bar 408 minimum resistance contact with the salicide contacts 132 is maintained because the need to connect the RF ground/source 404 with the RF ground/source bar 408 via a Metal-1 contact is eliminated.

After etching the dielectric 134 to define the shield 136, the drain via 142 and the RF ground/source bar 408, the barrier layer 143 may be deposited. By way of example and not by way of limitation, the barrier layer 143 can be a titanium/titanium nitride layer. It is to be understood that the chemical composition of the barrier layer 143 is not essential, what is important is that the barrier layer 143 possess the properties of a good diffusion barrier, high electrical conductivity, good adhesion, resistance to electromigration, and stability at high temperatures.

Regardless of the barrier layer 143 deposition, the shield 136, the drain via 142 and the RF ground/source bar 408 are filled with a low resistivity material by one or more deposition steps. As an exemplary illustration, the low resistivity material can be a refractory metal, or more specifically, a metal including tungsten. However, it is to be understood that the type of low resistivity material chosen is not essential.

With regard to FIGS. 4-6, the shield 136 is commonly employed as a ground shield to shunt capacitive substrate current created by the presence of an inductor 424 over the substrate 402. The shield 136 also reduces the eddy currents induced between the inductor 424 and the substrate 402. By reducing capacitive substrate current and eddy currents, a higher Q value can be obtained during operation of the RF CMOS, wherein Q is defined as (the energy stored in an inductive component)/(the energy dissipated as heat in the resistive component). The higher the Q factor of the system, the closer the resistive value of the component approaches zero.

One of the important advantages of this invention is that the shield 136 can be easily formed through a single damascene process that makes use of materials and techniques already employed by modern CMOS processes. The single damascene process allows the designer to fabricate the shield 136 in electrical contact with the RF ground/source 404 through the use of a low resistivity material entirely contained within the first dielectric 134. By forming the electrical contact between the shield 136 and the RF ground/source 404 entirely within the first dielectric 134, the Metal-1 connection between the shield 136 and the RF ground/source 404, of the prior art, can be eliminated.

Furthermore, the single damascene process also reduces resistance between the shield 136 and the RF ground/source 404. Since serial resistances are additive, by eliminating the need for the Metal-1 layer to connect the RF ground/source 404 with the shield 136, the contact resistance of such interface is eliminated and the overall resistance of the conductive path between the RF ground/source 404 with the shield 136 is reduced.

After filling the shield 136, the drain via 142 and the RF ground/source bar 408, the excess fill is removed by planarization techniques well known within the art, such as, chemical mechanical polishing (CMP). After planarization, a second dielectric 409 is deposited, masked, and etched by techniques well known in the art, to form the metal drain interconnect 144. The metal drain interconnect 144 is filled by a metal layer deposition step to provide electrical contact to the RF drain 406.

After planarizing the second dielectric 409 and the metal drain interconnect 144, the inductor 424 is then formed by a damascene process as well. Initially, the inductor 424 is formed by depositing a third dielectric layer 410, masking, etching, and then filling with a conductive material to form a first inductor level 412. Next, a fourth dielectric layer 414 is deposited, masked, etched, and then filled with a conductive material to form a second inductor level 416. Then a fifth dielectric layer 418 is deposited, masked, etched, and then filled with a conductive material to form a third inductor level 420. Finally, a passivating layer 422 is deposited to encapsulate the device.

Although the present embodiment depicts the inductor 424 comprised by three inductor levels, it is to be understood that any number of inductor levels is encompassed within the scope of this disclosure.

Referring now to FIG. 5, therein is shown a plan view of FIG. 4 with dielectric layers removed. FIG. 5 shows the isolation regions 102, the gate oxide layer 110, the gate 112, the material 130, the salicide regions 132, the shield 136, the drain via 142, the metal drain interconnect 144, the RF ground/source 404, the RF drain 406, the RF ground/source bar 408 and the inductor 424. By removing the dielectrics, some key aspects of an embodiment of the invention may be shown. Most notable is the formation of the shield 136 directly connected to the RF ground/source bar 408. By forming the shield 136 and the RF ground/source bar 408 as a unitary element, a low resistance gate shield can be formed in a single process step, thereby eliminating the expense and time of additional manufacturing steps.

Referring now to FIG. 6, therein is shown a cross-sectional view of an intermediate fabrication stage of the Integrated circuit system 400, of FIG. 4. FIG. 6 illustrates the isolation regions 102, the gate oxide layer 110, the gate 112, the active region 128, the material 130, the salicide contacts 132, the first dielectric layer 134, the substrate 402, the RF ground/source 404 and the RF drain 406.

FIG. 6 highlights the differences between the prior art methods and the present invention by illustrating the formation of the first dielectric layer 134 before the ground shield is formed. As mentioned above, RF CMOS prior art methods form the ground shield first and then deposit the dielectric. Additionally, these methods form the ground shield using high resistivity polysilicon materials.

Unlike prior art methods, the present invention forms the first dielectric layer 134 first and then forms the shield 136, of FIGS. 4 and 5, into or through the first dielectric layer 134. This method enables consolidation of the shield 136 formation step with the formation of the drain via 142 and the RF ground/source bar 408. By forming all features within the first dielectric layer 134 by a single masking step, the difficulty of forming the shield 136 from a low resistivity material is overcome, as no additional metal deposition and etch is required.

Figure 7:
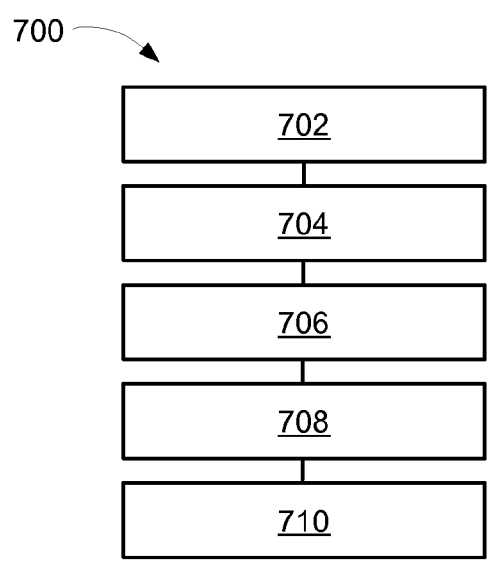
FIG. 7 is a flow chart for fabricating an integrated circuit system in accordance with an embodiment of the present invention.

Referring now to FIG. 7, therein is shown a flow chart for an integrated circuit system 700 for fabricating the integrated circuit system 100 or 400 in accordance with an embodiment of the present invention. The integrated circuit system 700 includes forming a substrate with an active region in a block 702; depositing a material over the substrate to act as an etch stop and define a source and a drain in a block 704; depositing a first dielectric over the substrate in a block 706; processing the first dielectric to form features within the first dielectric including a shield in a block 708; and depositing fill within the features to electrically connect the shield to the source of the active region by a single process step in a block 710.

A principle advantage of the present invention is that it reduces the cost of manufacturing an integrated circuit system. The cost of manufacturing is reduced because the additional deposition, masking and reduction etching of a shield material separate from source bar and via formation is eliminated. The present invention combines the shield formation step with the source bar formation step and the via formation step, and consequently employs a single masking, etching and deposition series to create the shield, source bar and the via(s).

Another advantage is that reduction etching of a desired low resistivity metal shield material is averted. Reduction etching of refractory metals, such as tungsten, can be difficult and the process is greatly simplified by filling features within a dielectric and polishing the excess fill.

Yet another important advantage of the invention is that the lowest possible resistance path between the shield and the source is established. Since the low resistivity material that forms the shield and the source bar is also used to connect these two regions, the lowest possible resistance path is formulated. Furthermore, by eliminating the need for the Metal-1 layer contact to connect the shield and the source, the additional contact resistance of such contact is eliminated and the overall resistance of the system is reduced.

Yet still another advantage of the present invention is the ease of integration of the process. Since the material for the salicide block and etch stop layer can be silicon nitride, it can be easily incorporated in processes well known in the art for dielectric contact etch, tungsten fill, and CMP planarization process modules.

These and other valuable aspects of the present invention consequently further the state of the technology to at least the next level.

Thus, it has been discovered that the integrated circuit system of the present invention furnishes important and heretofore unknown and unavailable solutions, capabilities, and functional advantages. For instance, by providing a process that reduces the number of deposition, masking and etching steps, provides the lowest possible resistance path between shield and source, and is very easily integrated into existing refractory metal fill processes, a more cost efficient and higher yield product can be produced. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for manufacturing an integrated circuit system comprising:
   forming a substrate with an active region;
   depositing a material over the substrate to act as an etch stop and define a source and a drain;
   depositing a first dielectric over the substrate;
   processing the first dielectric to form features within the first dielectric including a shield; and
   depositing fill within the features to electrically connect the shield to the source of the active region by a single process step.

2. The method as claimed in claim 1 further comprising:
   depositing a barrier layer before depositing fill within the features.

3. The method as claimed in claim 1 further comprising:
   removing excess fill while maintaining the electrical connection between the shield and the source.

4. The method as claimed in claim 1 further comprising:
   forming an inductor above the shield.

5. The method as claimed in claim 1 further comprising:
   configuring the shield to alter Miller capacitance, hot carrier injection occurrences, or capacitive substrate current affects on Q factor.

* * * * *